(12) United States Patent
MacQuarrie et al.

(10) Patent No.: US 6,650,016 B1
(45) Date of Patent: Nov. 18, 2003

(54) SELECTIVE C4 CONNECTION IN IC PACKAGING

(75) Inventors: Stephen W. MacQuarrie, Vestal, NY (US); Irving Memis, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/262,753

(22) Filed: Oct. 1, 2002

(51) Int. Cl.[7] ............................ H01L 23/48; H01L 21/44
(52) U.S. Cl. ...................... 257/738; 257/779; 257/780; 257/782; 438/108; 438/613; 228/180.22
(58) Field of Search ................................. 257/734, 737, 257/738, 778, 779, 780, 781, 782, 786; 438/106, 108, 109, 612, 613, 614; 228/180.21, 180.22; 361/742, 743, 760, 767, 768, 777

(56) References Cited

U.S. PATENT DOCUMENTS

| | | | | |
|---|---|---|---|---|
| 5,400,950 A | * | 3/1995 | Myers et al. | 228/180.22 |
| 5,677,575 A | * | 10/1997 | Maeta et al. | 257/778 |
| 5,748,450 A | * | 5/1998 | Kim et al. | 361/777 |
| 5,773,882 A | * | 6/1998 | Iwasaki | 257/692 |
| 5,872,393 A | * | 2/1999 | Sakai et al. | 257/664 |
| 6,229,219 B1 | | 5/2001 | Bhagath et al. | |
| 6,380,002 B2 | * | 4/2002 | Hsu et al. | 438/118 |

FOREIGN PATENT DOCUMENTS

| | | | | |
|---|---|---|---|---|
| JP | 01185952 A | * | 7/1989 | H01L/21/92 |
| JP | 07273243 A | * | 10/1995 | H01L/23/12 |

* cited by examiner

Primary Examiner—David L. Talbott
Assistant Examiner—Alonzo Chambliss
(74) Attorney, Agent, or Firm—R. Kaschak

(57) ABSTRACT

In an integrated circuit package employing solder bump technology, a metal layer placed on the surface of a substrate below an array of bonding pads is split and displaced from its axis at selected locations to preserve electrical continuity, but to also lower the height of an insulating solder mask layer at those locations.

13 Claims, 1 Drawing Sheet

SELECTIVE C4 CONNECTION IN IC PACKAGING

TECHNICAL FIELD

The field of the invention is that of packaging integrated circuits, in particular the connection technology referred to as "flip-chip" or C4.

BACKGROUND OF THE INVENTION

In the process of fabricating substrates for connecting sets of integrated circuits, (ICs) manufacturers sometimes have occasion to make selected contacts with the solder bump connections on the bottom of an integrated circuit. For example, there may be a set of similar products that have different connections to a standard chip, so that the kth bump on the chip is used with some packages and not used with others.

In the past, as shown in FIG. 3 in cross section, a chip 10 having a ball grid array of solder bump contacts 30 (referred to as "flip chip" technology or as C4 technology) would all be soldered to metal contact pads 110 in a corresponding contact array on the top surface 135 of the substrate. In that case, the chip would have to be designed and manufactured with only those contacts that were used. U.S. Pat. No. 6,229,219 illustrates different chips with irregular sets of contacts on the bottom. All of the contacts on each chip are bonded to corresponding contacts on the package. The package accommodates two different chips by having empty locations on the chip—i.e. a chip has an empty location at the kth slot on that chip so there is no bond formed between the contact at the kth location and the empty slot on the chip.

Alternatively, a chip would be bonded to a contact on the package, but contacts that were not used would be "floating", i.e. not connected to further layers of the package. This meant that there was potential for such contacts pads 110 to short out to other contacts. Additionally, the metal on the substrate represented capacitance that might affect the operation of the chip. Removing the contact on the bottom of the chip would cost money for different masks in forming the chip contacts. Removing the contact after the chip is formed would require extra handling, with the possibility of damaging the chip. Removing the contact pad 110 at that location was a possibility, but there was a chance that the solder bump 30 would flow to short out an adjacent contact, or a via that had been fabricated below the contact pad 110, even with the presence of solder mask 130, a conventional dielectric layer that is deposited and patterned photolithographically. The solder mask in this prior art view is shown as separating the solder bumps 30 and the corresponding metal pads 110 that the solder bumps make contact with, as is conventional.

SUMMARY OF THE INVENTION

The invention relates to a structure of isolating unused solder bumps on the bottom of an IC by patterning the metal interconnect on the top surface of the substrate, together with the solder mask, to isolate the unused solder bumps.

A feature of the invention is changing the shape of a metal interconnect passing under an unused chip contact to form a depression in the dielectric solder mask to lower the height of the solder mask at the selected location.

Another feature of the invention is patterning the solder mask to place a layer of dielectric between a contact on a chip and a corresponding contact on the package.

DETAILED DESCRIPTION

Figure 1:
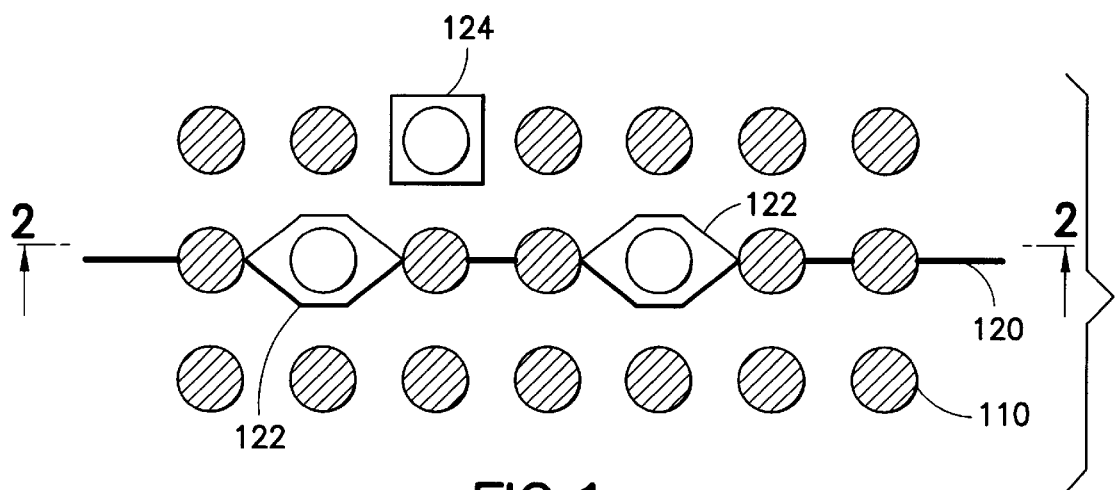
FIG. 1 shows a top view of a structure according to the invention.

Referring again to FIG. 3, there is shown a cross section of a portion of an IC packaging substrate, in which chip 10 is connected to the package through a set of C4 solder bumps 30 that bond to an array of connection pads 110. The connection pads are connected to interconnects that extend down through top surface 135 of the substrate and connect the iC shown to other ICS and/or to the outside world. Solder mask 130 is a dielectric layer that is put down after the conductors on the top surface has been patterned and before the chips are bonded. It isolates the solder bumps 30 by surrounding the contact pads 110.

Figure 3:
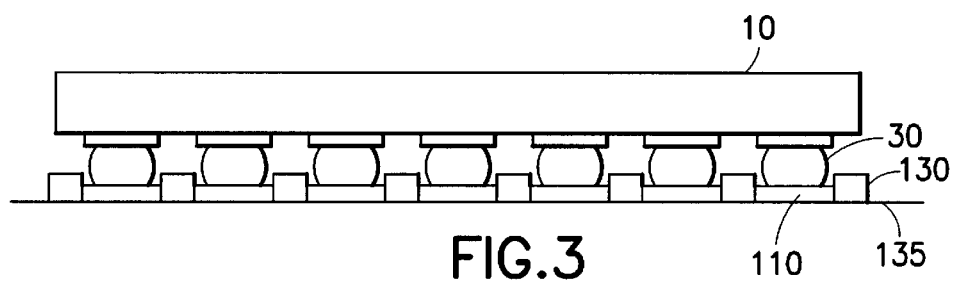
FIG. 3 shows a prior art cross section corresponding to FIG. 2.

Solder mask 30 is put down as a photo-sensitive liquid or film after the metal layer 110 has been patterned, and then patterned by exposure to light of the appropriate characteristic and then developed after patterning. As can be seen in FIG. 3, the standard way of patterning a solder mask is as a separation and isolation feature between the solder bumps, forming a wall around each contact pad 110. In the cross section of FIG. 3, none of the solder balls are shorted together by metal 110. If any were, i.e. if the metal 110 extended between the contacts, layer 30 would be slightly higher where it passes over a layer of metal 110.

A feature of the prior art technique is that modification of the IC pinout (or connections to the solder bumps) is expensive, so that cost considerations dictate that the solder bump-contact 110 connection remain. That, in turn, means that the solder ball attached to chip 10 is soldered to the contact 110 on the surface and therefore that there may be problems with capacitance added to the chips by the effect of connections on the substrate. Those skilled in the art are aware that a contact pad 110 is typically connected to a via extending downward through the substrate, so that there is a significant amount of area in electrical contact with the solder ball 30.

According to the invention, the arrangement of the IC is unchanged, but accommodation to different connections on the substrate is made by isolating the unused solder bumps on the chip by a patterned dielectric that does not interfere with chip operation.

Referring now to FIG. 1, there is shown a plan view of an area of a package substrate according to the invention, in which a 3×7 array of contact pads 110 conforms to the standard I/O of a particular IC. Not all of the contacts are used, however. In this example, two contacts in the middle row are not used.

A heavy line 120 passing from left to right along the middle row of the array represents a conductive interconnect that is required according to the system being implemented (connecting contacts 1, 3, 4, 6 and 7). The line passes through seven contiguous contact locations in this example. Two contact locations are not used in this example, however, both denoted by numeral 122 and located in an area of line 120 having the shape of a hexagon. The function of the layout shown is that the conductive interconnect member 120 is displaced from the location of the solder bumps on chip 10; i.e. it splits, defining a hexagonal opening between the two sides. The solder mask that will be put down before the chip bonding operation fills the hexagonal opening and forms a depression in the top surface of the solder mask layer 125 at that location. That depression surrounds the solder ball on the chip 10 and isolates it from surrounding connectors, so that any conductive material turning to the molten state during the heating and solder reflow process is confined. In the bonding operation, the solder balls 30 on the bottom of chip 10 will change shape, lowering chip 10 slightly. The dielectric material 125 located between ball 30 and contact pad 110 prevents an electrical path from forming. Thus, the connections on the lower face of IC 10 are not disturbed, but the unused connections do not affect the substrate connections (e.g. by causing unwanted shorts) or the operations of the chip (by changing capacitance).

Figure 2:
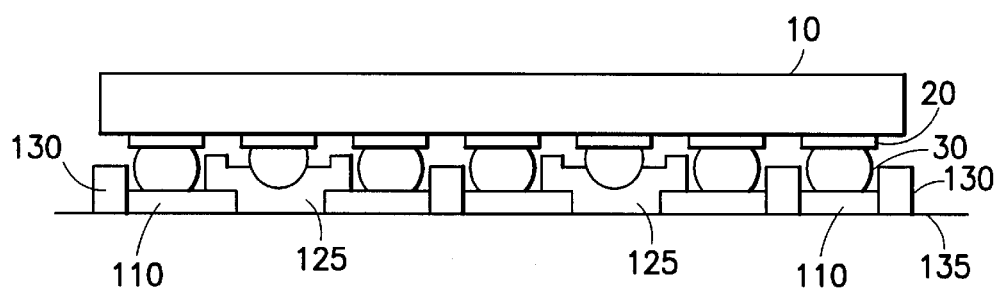
FIG. 2 shows a cross section through the view of FIG. 1.

Looking at the side view in FIG. 2, the section A—A is taken past the interconnect 120, so it does not show in the cross section, i.e. the line is labeled 110 where it passes through pad 110 and 122 where it passes through hexagon 122. The two thin lines of hexagons 122 are in the plane of the cross section. Thus, in FIG. 2, both areas 135 show a bump on each side, where the solder mask goes over the interconnect 122.

At the top row of FIG. 1, box 124 defines an area around a contact location that will enclose a dielectric pad 125, formed from the solder mask material. This pad prevents a path from being formed between the contact 110 at that location and the chip contact above the location. This arrangement is useful for a situation in which there is a contact on the chip that is not used in this particular system and a contact in the substrate that does connect or may short to another interconnect on or in the substrate.

Thus, a broader class of chips and/or substrates may be used with the invention, since a stock substrate having a contact 110 connected to other wires in the substrate that would increase the capacitive loading on the circuit in the chip (if contact were made) can still be used. Similarly, an interconnect in the substrate that shorts chip contacts K and L in one version of a system may be blocked, so that a system that does not have that short can still use the same substrate.

Those skilled in the art will be aware that having a closed hexagon is not required and that a single-sided structure would also do to preserve the continuity of line 120. The line 120 does not have to be a straight line and it may have a right angle or other shape. A diamond shape, rectangle, parallelogram or other shape (preferably a closed curve) could be used instead of the hexagon.

Preferably, the thickness of the solder mask is thick enough to prevent electrical contact and thin enough that it does not prevent the other solder bumps from making contact with the pads 110 that the bond to. Some tolerance is permissible, as the solder bumps will flow during the bonding process. The invention has been described in the context of the flip chip process developed by IBM, but other technologies in which a set of contacts on the bottom of an IC are bonded to an array on the top of the substrate could also be used.

While the invention has been described in terms of a single preferred embodiment, those skilled in the art will recognize that the invention can be practiced in various versions within the spirit and scope of the following claims.

What is claimed is:

1. A substrate for connecting integrated circuits comprising: a substrate top surface with at least one standard-pattern array of contacts formed thereon and a patterned dielectric layer disposed on said top surface, said patterned dielectric layer being patterned to surround and isolate from one another a subset of said standard-pattern array of contacts in which a conductive contact interconnect member is disposed on said top surface and electrically connecting at least some of said array of contacts, said contact interconnect member being displaced from at least one selected location of the contact locations in said at least one array, and said patterned dielectric layer covers said at least one selected location, wherein an integrated circuit contact on a bottom surface of an IC at said selected location of said top surface is insulated from a contact, of said array of contacts, located at said selected location.

2. A substrate according to claim 1, in which said contact interconnect member is displaced from said at least one selected location in a closed curve surrounding said at least one selected location, wherein said dielectric layer has a depression within said closed curve at said at least one selected location.

3. A substrate according to claim 1, in which said conductive interconnect member disposed on said top surface and electrically connecting a subset of contacts extends past at least one non-connected contact to which it is not connected.

4. A substrate according to claim 3, in which said conductive interconnect member forms a closed curve surrounding said at least one non-connected contact.

5. A substrate according to claim 4, in which said conductive interconnect member forms a hexagon surrounding said at least one non-connected contact.

6. A substrate according to claim 4, in which said conductive interconnect member forms a quadrilateral surrounding said at least one non-connected contact.

7. A substrate for connecting integrated circuits comprising: a substrate top surface with at least one standard-pattern array of contacts formed thereon and a patterned dielectric layer disposed on said top surface, said patterned dielectric layer being patterned to surround and isolate from one another a subset of said standard-pattern array of contacts in which said patterned dielectric layer covers at least one selected location, wherein an integrated circuit contact on a bottom surface of an IC at said selected location of said top surface is insulated from a contact, of said array of contacts, located at said selected location.

8. A substrate according to claim 7, in which said patterned dielectric is enclosed by a conductive interconnect member forming a closed curve surrounding said at least one non-connected contact.

9. A substrate according to claim 8, in which said conductive interconnect member forms a hexagon surrounding said at least one non-connected contact.

10. A substrate according to claim 9, in which said conductive interconnect member forms a quadrilateral surrounding said at least one non-connected contact.

11. A method of fabricating a substrate for connecting integrated circuits having a substrate top surface with at least one standard-pattern array of contacts formed thereon and a patterned dielectric layer disposed on said top surface, comprising the steps of:

providing a substrate with a set of interconnections connecting at least some of said standard-pattern array of contacts to a conductive contact interconnect member disposed on said top surface and electrically connecting at least some of said array of contacts, said contact interconnect member being displaced from at least one selected location of the contact locations in said at least one array;

patterning the dielectric layer to surround and isolate from one another a subset of said standard-pattern array of contacts and to cover said at least one selected location, wherein an integrated circuit contact on a bottom surface of an IC at said selected location of said top surface is insulated from a contact, of said array of contacts, located at said selected location.

12. A method according to claim 9, in which said contact interconnect member is displaced from said at least one selected location in a closed curve surrounding said at least one selected location.

13. A method according to claim 9, in which said dielectric layer has a depression within said closed curve at said at least one selected location.

* * * * *